(12) United States Patent
Mei et al.

(10) Patent No.: US 11,515,359 B2
(45) Date of Patent: Nov. 29, 2022

(54) ARRAY SUBSTRATE AND DISPLAY DEVICE

(71) Applicant: TCL CHINA STAR OPTOELECTRONICS TECHNOLOGY CO., LTD., Guangdong (CN)

(72) Inventors: Yuan Mei, Shenzhen (CN); Jincheng Li, Shenzhen (CN); Haoxu Wu, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 317 days.

(21) Appl. No.: 16/631,251

(22) PCT Filed: Dec. 18, 2019

(86) PCT No.: PCT/CN2019/126204
§ 371 (c)(1),
(2) Date: Jan. 15, 2020

(87) PCT Pub. No.: WO2021/114327
PCT Pub. Date: Jun. 17, 2021

(65) Prior Publication Data
US 2021/0408122 A1 Dec. 30, 2021

(30) Foreign Application Priority Data
Dec. 10, 2019 (CN) .......................... 201911259325.0

(51) Int. Cl.
H01L 27/28 (2006.01)
H01L 51/00 (2006.01)
H01L 51/05 (2006.01)

(52) U.S. Cl.
CPC ........ *H01L 27/286* (2013.01); *H01L 51/0035* (2013.01); *H01L 51/0545* (2013.01)

(58) Field of Classification Search
CPC ..... H01L 27/1214–1296; H01L 27/281; H01L 27/283; H01L 27/286;
(Continued)

(56) References Cited

U.S. PATENT DOCUMENTS

2008/0124522 A1* 5/2008 Chuman ............... H01L 51/055
428/141
2019/0187504 A1* 6/2019 Xu ........................ G09G 3/3655

FOREIGN PATENT DOCUMENTS

WO WO-2018219067 A1 * 12/2018 ........... H01L 27/092

OTHER PUBLICATIONS

Li et al., "High Mobilities in Layered InSe Transistors with Indium-Encapsulation-lnduced Surface Charge Doping", Adv.Mater.2018, 30, 1803690, First published: Sep. 14, 2018. (Year: 2018).*

* cited by examiner

Primary Examiner — Andres Munoz
(74) Attorney, Agent, or Firm — PV IP PC; Wei Te Chung; Ude Lu

(57) ABSTRACT

The present disclosure provides an array substrate and a display panel. The driving circuit layer of the array substrate provided with a first thin-film transistor (TFT) and a second TFT. An exemplified active layer of a P-type TFT is formed by organic conductive polymer material. By using organic conductive polymer materials as the active layer material of the first TFT, the technical problems of the flexibility of the display substrate resulting by the characteristics of the low temperature polysilicon material are solved. The flexibility of the array substrate is enhanced.

8 Claims, 5 Drawing Sheets

(58) Field of Classification Search
CPC ... H01L 27/3244–3279; H01L 51/0034–0044; H01L 51/0541; H01L 51/0545; H01L 51/0558; H01L 51/057
See application file for complete search history.

ARRAY SUBSTRATE AND DISPLAY DEVICE

CROSS REFERENCE TO RELATED APPLICATIONS

The present disclosure claims priority of China Patent application filed with the National Intellectual Property Administration on Dec. 10, 2019, application number is 201911259335.0 and the title is "ARRAY SUBSTRATE AND DISPLAY PANEL". The content of the application is cited and incorporated in the present disclosure.

FIELD OF INVENTION

The present disclosure relates to the field of display technologies, and more particularly, to an array substrate and a display panel.

BACKGROUND OF INVENTION

Thin-film transistors, which adopt low-temperature polysilicon as an active layer, account for a major proportion in the field of display devices. Due to the properties of low-temperature polysilicon, array substrates which adopt low-temperature polysilicon thin-film transistors in the active layer region cannot be flexible.

That is, the flexibility of the array substrate is restricted by the properties of low-temperature polysilicon.

Technical Problems

The present disclosure provides an array substrate and a display device to improve the flexibility of array substrates which is restricted by the properties of low-temperature polysilicon.

That is, the array substrate is restricted by the properties of low-temperature polysilicon.

SUMMARY OF INVENTION

To solve the problems above, the present disclosure provides the following technical solutions.

The present disclosure provides an array substrate, comprising:

A base.

A driving circuit layer provided with a first thin-film transistor (TFT) and a second TFT.

A material of an active layer of the first TFT is organic conductive polymer material.

In the array substrate of the present disclosure, a source of the first TFT, a drain of the first TFT, and the active layer of the first TFT are formed on a same side of a first insulating layer.

In the array substrate of the present disclosure, a gate of the first TFT is formed on another side of the first insulating layer.

In the array substrate of the present disclosure, an active layer of the second TFT comprises stacked layers of indium and indium selenide.

In the array substrate of the present disclosure, the active layer of the second TFT is located in a first concave penetrating though a second insulating layer.

In the array substrate of the present disclosure, a gate of the second TFT is located in a second concave penetrating though the second insulating layer.

In the array substrate of the present disclosure, the gate of the second TFT, a source of the second TFT, and the gate of the first TFT are disposed in a same layer.

In the array substrate of the present disclosure, the array substrate further comprising a pixel electrode, wherein a drain of the second TFT and the pixel electrode are disposed in a same layer.

In the array substrate of the present disclosure, the organic conductive polymer material comprises triphenylamine or triphenylamine derivative.

The present disclosure provides a display device, comprising:

An array substrate.

A luminous unit.

In the array substrate comprises:

A base.

A driving circuit layer provided with a first thin-film transistor (TFT) and a second TFT.

A material of an active layer of the first TFT is organic conductive polymer material.

In the display device of the present disclosure, the gate of the second TFT, a source of the second TFT, and the gate of the first TFT are disposed in a same layer.

In the display device of the present disclosure, a source of the first TFT, a drain of the first TFT, and the active layer of the first TFT are formed on a same side of a first insulating layer.

In the display device of the present disclosure, a gate of the first TFT is formed on another side of the first insulating layer.

In the display device of the present disclosure, an active layer of the second TFT comprises stacked layers of indium and indium selenide.

In the display device of the present disclosure, the active layer of the second TFT is located in a first concave penetrating though a second insulating layer.

In the display device of the present disclosure, a gate of the second TFT is located in a second concave penetrating though the second insulating layer.

In the display device of the present disclosure, the display panel further comprising a pixel electrode, wherein a drain of the second TFT and the pixel electrode are disposed in a same layer.

In the display device of the present disclosure, the organic conductive polymer material comprises triphenylamine.

In the display device of the present disclosure, the organic conductive polymer material comprises triphenylamine derivative.

BENEFICIAL EFFECTS

The present disclosure provides an array substrate and a display panel. The driving circuit layer of the array substrate is provided with a first TFT and a second TFT. An exemplified active layer of a P-type TFT is formed by organic conductive polymer material. Based on this structure, by using the organic conductive polymer materials as the active layer material of the first TFT, the technical problems of the flexibility of the display substrate resulting from the characteristics of the low temperature polysilicon material are solved. The flexibility of the array substrate is enhanced. The size of the display device is reduced, the aperture ratio is increased, and a leakage current is reduced because high mobility of the first TFT is achieved due to the high mobility of the organic conductive polymer materials.

DETAILED DESCRIPTION OF PREFERRED EMBODIMENTS

Figure 1:
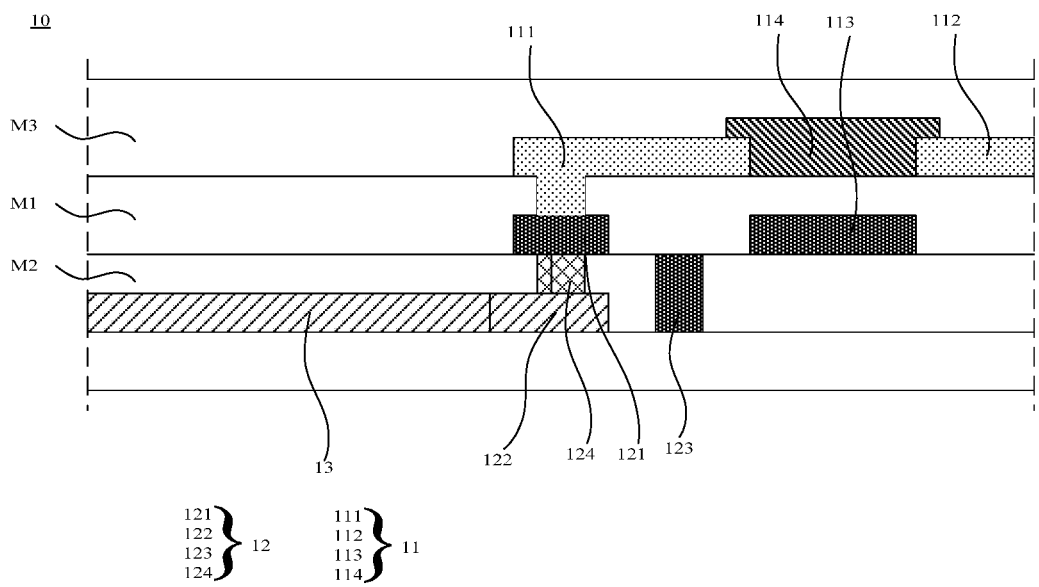
FIG. 1 illustrates a structural diagram of an array substrate of an embodiment of the present disclosure.

The present disclosure provides an array substrate and a display device. In order to clarify the technical solutions of embodiments of the present disclosure, the present disclosure is described by the embodiments in detail accompany with drawings. Obviously, the mentioned embodiments are utilized to clarify the present discloser rather than limit the present disclosure.

Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. The terms "first", "second", etc. are used for descriptive purposes only instead of indicating or implying their relative importance or the number of indicated technical features. Thus, features defined as "first", "second", etc. may explicitly or implicitly include one or more of the features.

The present disclosure improves the flexibility of the array substrate which is restricted by the properties of low-temperature polysilicon in the existing array substrates.

In one of the embodiments, as shown in FIG. 1, an array substrate 10 provided by the present disclosure comprises the following components.

A base.

A driving circuit layer is provided with a first thin-film transistor (TFT) 11 and a second TFT 12.

A material of an active layer 111 of the first TFT 11 is an organic conductive polymer material.

In one of the embodiments, the first TFT 11 is a P-type TFT and the second TFT 12 is an N-type TFT while the array substrate is a composite semiconductor component.

The present disclosure provides an array substrate. The driving circuit layer of the array substrate is provided with a first TFT and a second TFT. An exemplified active layer of a P-type TFT is formed organic conductive polymer material. Based on this structure, by using organic conductive polymer materials as the active layer material of the first TFT, the technical problems of the flexibility of the display substrate resulted by the characteristics of the low temperature polysilicon material are solved. The flexibility of the array substrate is enhanced. The size of the display device is reduced, the aperture ratio is increased, and a leakage current is reduced because high mobility of the first TFT is achieved due to the high mobility of the organic conductive polymer materials.

Please refer to FIG. 1. The first TFT 11 includes a source 111, a drain 112, a gate 113, and an active layer 114. The second TFT 12 includes a source 121, a drain 122, a gate 123, and an active layer 124.

In one embodiment, as shown in FIG. 1, the source 111, the drain 112, and the active layer 114 of the first TFT 11 are formed on the same side of the first insulating layer M1.

In one embodiment, as shown in FIG. 1, the gate 113 of the first TFT is formed on the other side of the first insulating layer M1.

In an embodiment, a material of the first insulating layer M1 is an organic insulating material or a multilayer inorganic insulating material.

In one embodiment, the active layer 124 of the second TFT 12 includes stacked layers of indium, indium selenide, etc. This embodiment uses indium selenide-based materials which have higher mobility characteristics than single crystal silicon at room temperature and combines organic conductive polymer materials having high mobility, such as triphenylamine to achieve flexible composite devices.

In one embodiment, as shown in FIG. 1, the active layer 124 of the second TFT 12 is disposed in a first concave penetrating through the second insulating layer M2. In this embodiment, by disposing the active layer 124 in a groove of the insulating layer, the panel area occupied by the active layer is reduced, so the aperture ratio is increased, and a film thickness of the array substrate is reduced.

In one embodiment, as shown in FIG. 1, the gate electrode 123 of the second TFT 12 is disposed in a second concave penetrating through the second insulating layer M2.

In one embodiment, the material of the second insulating layer M2 is an organic insulating material, or a multilayer inorganic insulating material.

In an embodiment, as shown in FIG. 1, the gate electrode 123 and the source electrode 121 of the second TFT 12 and the gate electrode 113 of the first TFT 11 are disposed in the same layer, that is, they are formed through the same process.

In one embodiment, as shown in FIG. 1, a pixel electrode 13 is further formed on the array substrate.

In one embodiment, as shown in FIG. 1, the drain electrode 122 of the second TFT 12 is disposed on the same layer as the pixel electrode 13.

In one embodiment, the organic conductive polymer material includes a triphenylamine or a triphenylamine derivative.

In order to obtain the array substrate shown in FIG. 1, the present application provides a corresponding array substrate preparation method, which includes the following steps as shown in FIG. 2 to FIG. 9.

In step a, the pixel electrode 13 and the drain electrode 122 are formed on the base substrate S.

Figure 2:
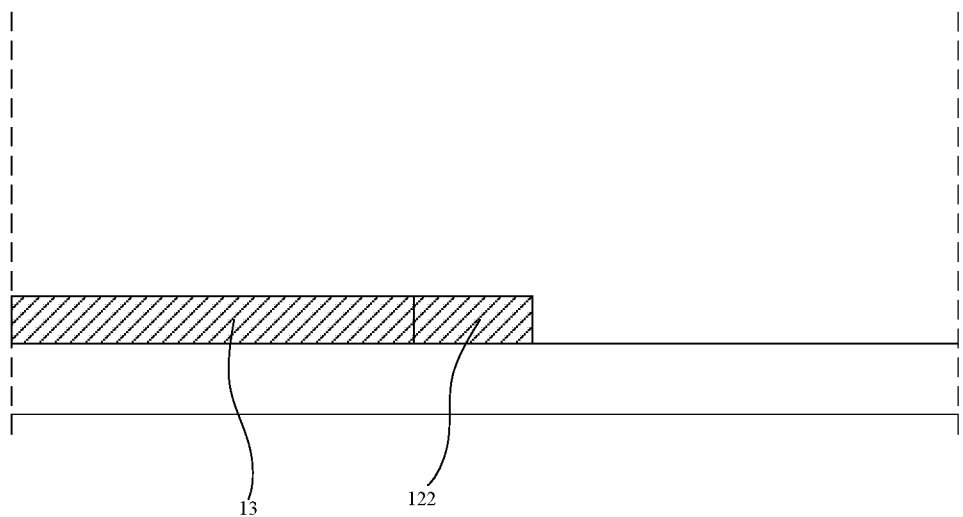
FIGS. 2-9 illustrate manufacturing processes of the array substrate of an embodiment of the present disclosure.

FIG. 2 illustrates a structure having a glass substrate on which a metal layer is deposited. The pixel electrode 13 and the drain electrode 122 are formed in the metal layer.

In step b, the second insulating layer M2, the first concave, and the second concave are formed.

Figure 3:
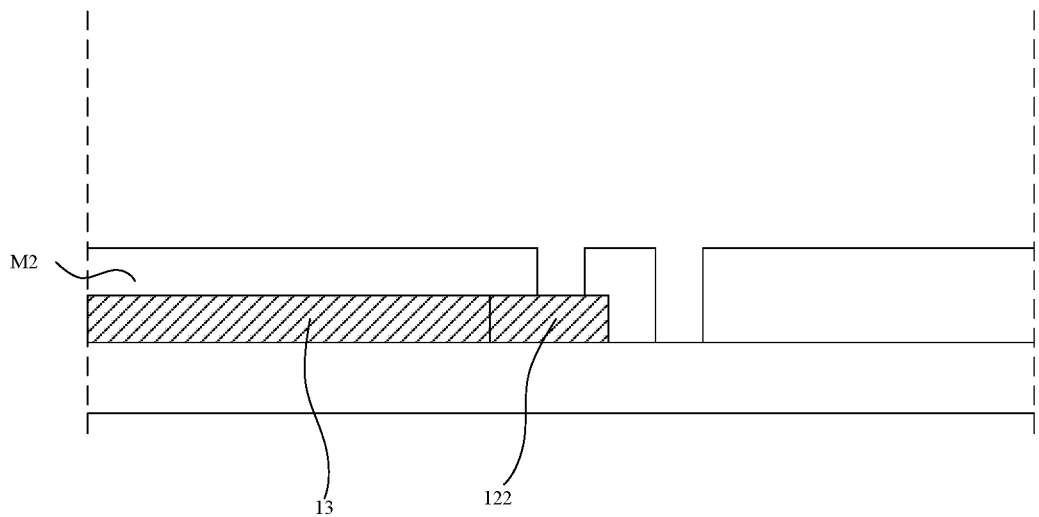

As shown in FIG. 3, the second insulating layer M2 is formed by depositing or coating an insulating layer material on the structure shown in FIG. 2. A corresponding groove-shaped pattern is formed by a photolithography technique and an etching technique.

In step c, an active layer 124 is formed.

Figure 4:
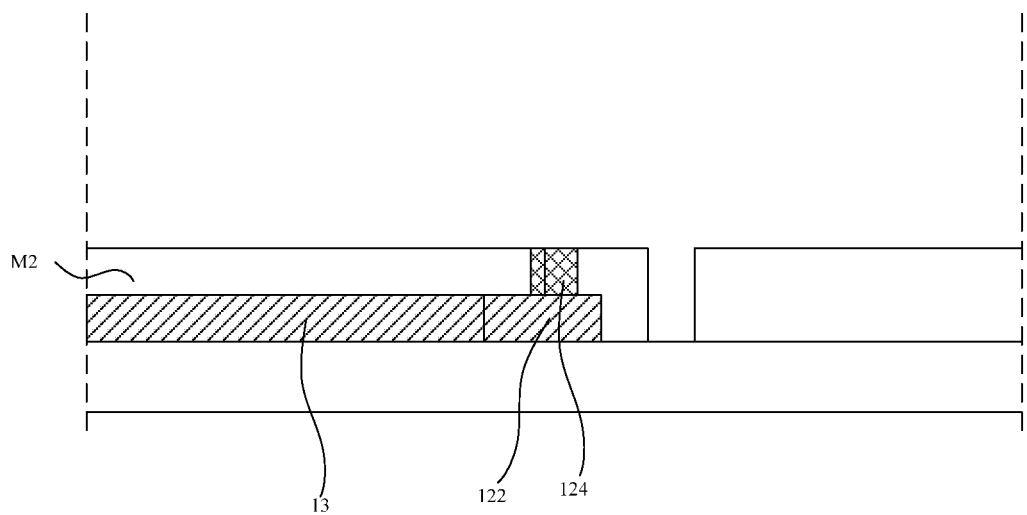

As shown in FIG. 4, on the structure shown in FIG. 3, indium selenide and indium are deposited by a physical vapor deposition technique to form the active layer and a surface carrier injection layer. A desired material is left on the substrate as the active layer 124 by an etching process.

In step d, the gate electrode 123, the gate electrode 113, and the source electrode 121 are formed.

Figure 5:
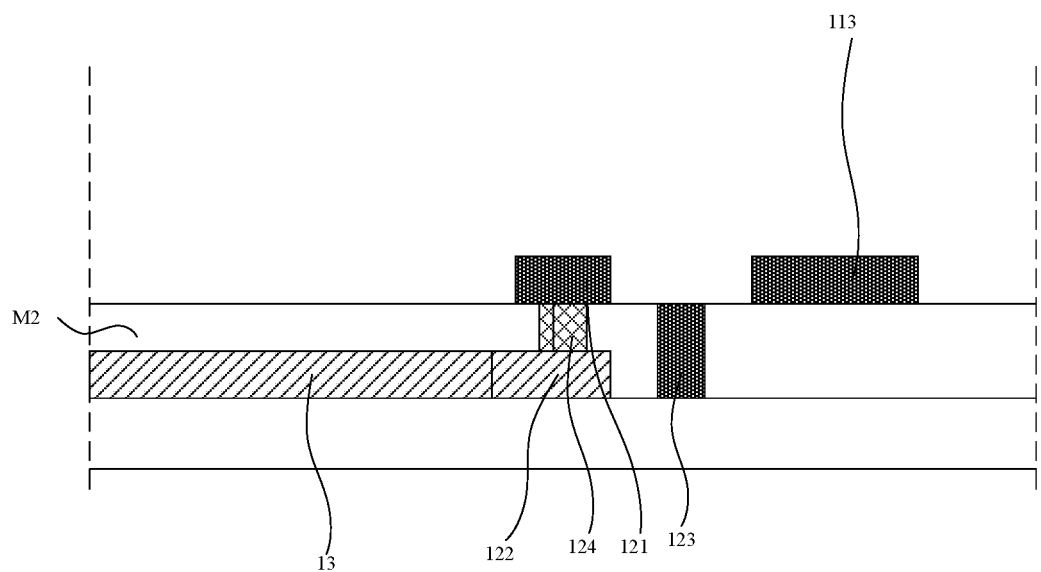

As shown in FIG. 5, on the structure shown in FIG. 4, a metal film layer is deposited using a physical vapor deposition technology. The gate electrode 123, the gate electrode 113, and the source electrode 121 are formed by using photolithography and etching.

Step e: forming the first insulating layer M1.

Figure 6:
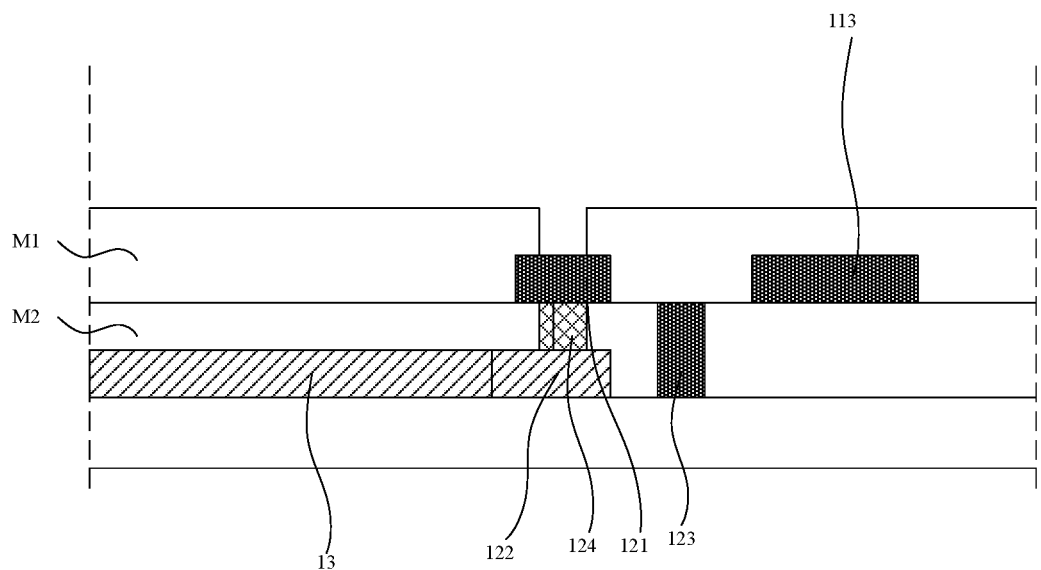

As shown in FIG. 6, the insulating layer M1 is covered on the upper part of the structure shown in FIG. 5, and a via hole is formed at a specific position by lithography.

Step f: forming the source 111, the drain 112, the data line, and the common electrodes.

Figure 7:
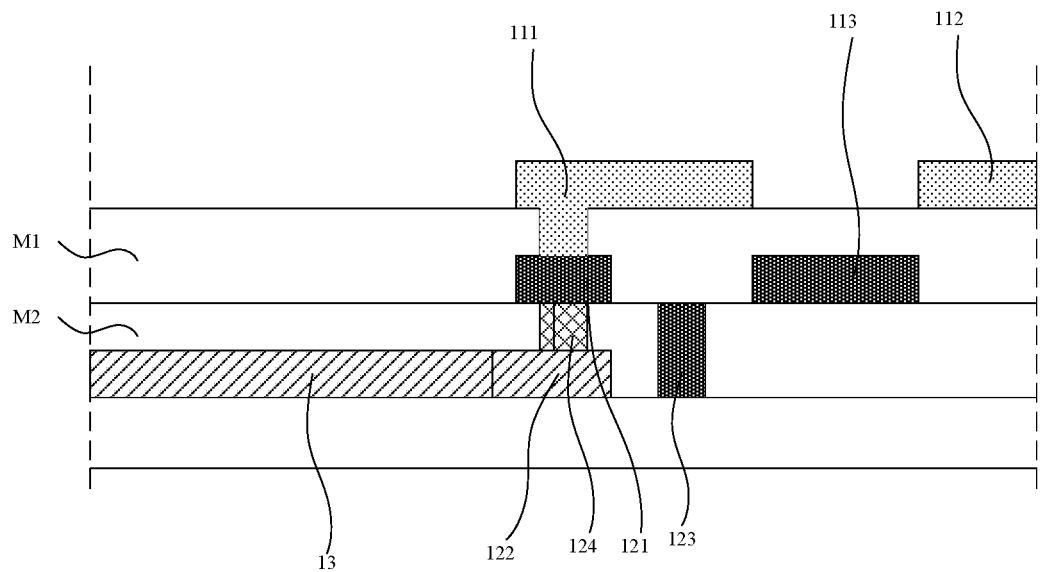

As shown in FIG. 7, the conductive film layer is deposited or coated on the surface of the structure shown in FIG. 6. The source electrode 111, the drain electrode 112, the data lines, and the common electrodes are etched by a photolithography technique.

In step g, an active layer 113 is formed.

Figure 8:
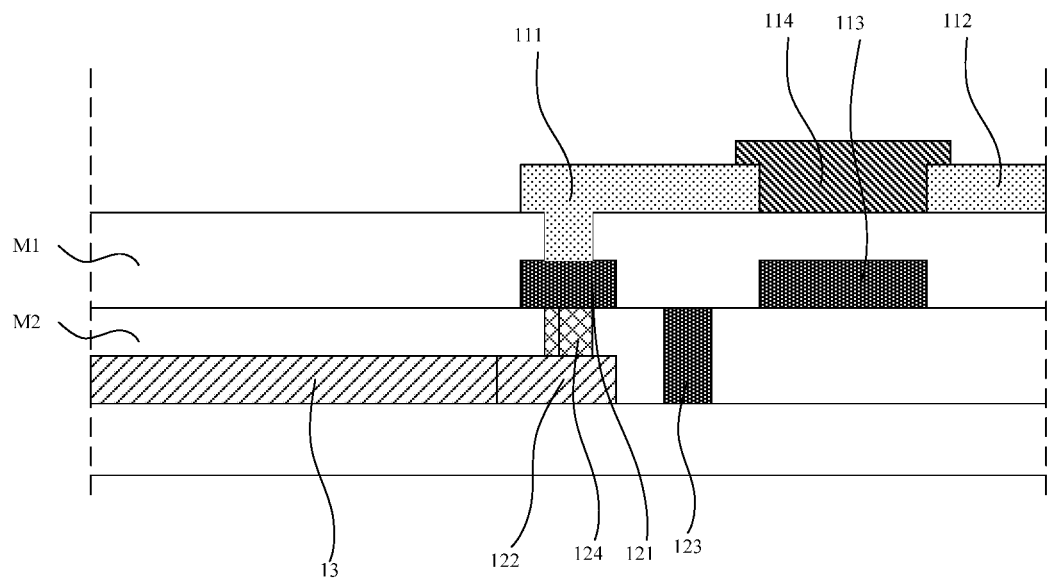

As shown in FIG. 8, on the structure shown in FIG. 7, a triphenylamine layer is formed by methods such as sol-gel, hydrothermal, coating, physical deposition, or chemical deposition. A pattern of the triphenylamine component, serving as the source layer 113, is obtained by photolithography the triphenylamine layer.

Step h, forming a third insulating layer M3.

Figure 9:
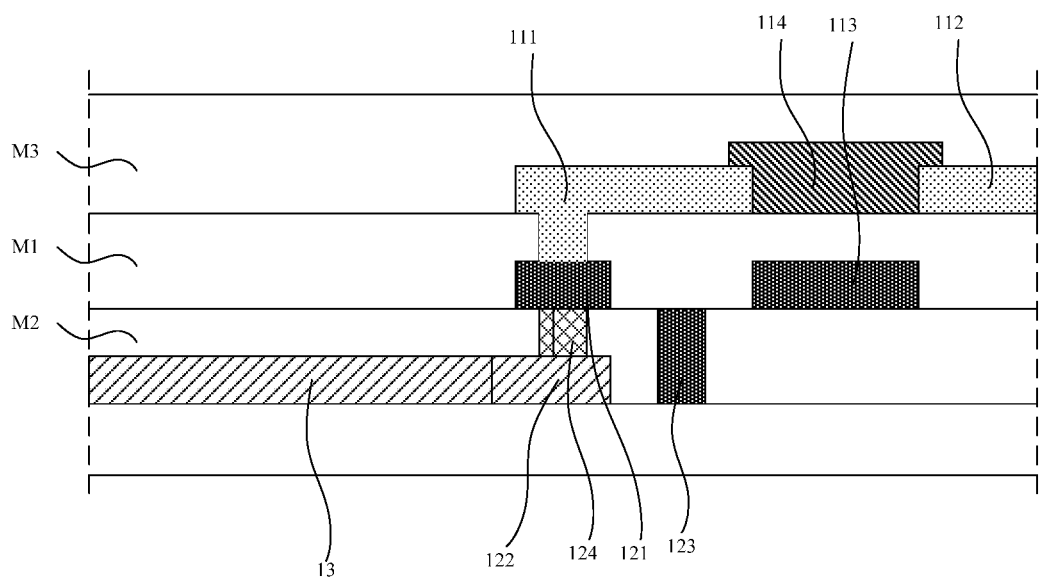

As shown in FIG. 9, the third insulating layer M3, serving as the packaging layer, passivation layer, buffer layer, etc., is formed by depositing an organic, inorganic, or low dielectric constant material by using methods such as sol-gel, hydrothermal, coating, physical deposition, or chemical deposition on the structure shown in FIG. 8.

In one embodiment, the display device provided in this embodiment of the present application includes following components.

As shown in FIG. 1, the array substrate includes the driving circuit layer having the first TFT 11 and the second TFT 12. The material of active layer 111 of the first TFT 11 is an organic conductive polymer material.

A light emitting unit is driven by the array substrate to emit light or control a backlight source.

In one embodiment, the display device can be a liquid crystal panel, an organic light-emitting diode panel, a mini light-emitting diode panel, etc.

In one embodiment, the first TFT 11 is a P-type thin film transistor, and the second TFT 12 is an N-type thin film transistor while the array substrate is a composite semiconductor device.

The present d embodiment provides a display device. The driving circuit layer of the array substrate is provided with a first TFT and a second TFT. An exemplified active layer of a P-type TFT is formed by an organic conductive polymer material. Based on this structure, by using the organic conductive polymer materials as the active layer material of the first TFT, the technical problems of the flexibility of the display substrate resulted by the characteristics of the low temperature polysilicon material are solved. The flexibility of the array substrate is enhanced. The size of the display device is reduced, the aperture ratio is increased, and a leakage current is reduced because high mobility of the first TFT is achieved due to the high mobility of the organic conductive polymer materials.

As shown in FIG. 1, the first TFT 11 includes the source 111, the drain 112, the gate 113, and the active layer 114. The second TFT 12 includes the source 121, the drain 122, the gate 123, and the active layer 124.

In one embodiment, as shown in FIG. 1, the source 111, the drain 112, and the active layer 114 of the first TFT 11 are formed on the same side of the first insulating layer M1.

In one embodiment, as shown in FIG. 1, the gate 113 of the first TFT is formed on the other side of the first insulating layer M1.

In an embodiment, a material of the first insulating layer M1 is an organic insulating material or a multilayer inorganic insulating material.

In one embodiment, the active layer 124 of the second TFT 12 includes stacked layers of indium, indium selenide, etc. This embodiment uses indium selenide-based materials which have higher mobility characteristics than single crystal silicon at room temperature This embodiment uses indium selenide-based materials which have higher mobility characteristics than single crystal silicon at room temperature and combines organic conductive polymer materials having high mobility, such as triphenylamine, to achieve flexible composite devices.

In one embodiment, as shown in FIG. 1, the active layer 124 of the second TFT 12 is disposed in a first concave penetrating through the second insulating layer M2. In this embodiment, by disposing the active layer 124 in a groove of the insulating layer, the panel area occupied by the active layer is reduced, so the aperture ratio is increased, and a film thickness of the array substrate is reduced.

In one embodiment, as shown in FIG. 1, the gate electrode 123 of the second TFT 12 is disposed in a second concave penetrating through the second insulating layer M2.

In one embodiment, the material of the second insulating layer M2 is an organic insulating material, or a multilayer inorganic insulating material.

In an embodiment, as shown in FIG. 1, the gate electrode 123 and the source electrode 121 of the second TFT 12 and the gate electrode 113 of the first TFT 11 are disposed in the same layer, that is, they are formed through the same process.

In one embodiment, as shown in FIG. 1, a pixel electrode 13 is further formed on the array substrate.

In one embodiment, as shown in FIG. 1, the drain electrode 122 of the second TFT 12 is disposed on the same layer as the pixel electrode 13.

In one embodiment, the organic conductive polymer material includes a triphenylamine or a triphenylamine derivative.

The embodiments above provide following effects.

The present disclosure provides an array substrate and a display panel. The driving circuit layer of the array substrate is provided with a first TFT and a second TFT. An exemplified active layer of a P-type TFT is formed by an organic conductive polymer material. Based on this structure, by using organic conductive polymer materials as the active layer material of the first TFT, the technical problems of the flexibility of the display substrate restricted by the characteristics of the low temperature polysilicon material are solved. The flexibility of the array substrate is enhanced. The size of the display device is reduced, the aperture ratio is increased, and a leakage current is reduced because high mobility of the first TFT is achieved due to the high mobility of the organic conductive polymer materials.

To conclude, although the present disclosure has been illustrated above with preferred embodiments, the above preferred embodiments are not intended to limit the present disclosure. A skilled person in the art can make obtain variation or modifications without departing from the aspect and scope of the present disclosure. Therefore, the protection scope of the present disclosure shall be subject to the scope defined by the claims.

What is claimed is:

1. An array substrate, comprising:
   a base; and
   a driving circuit layer provided with a first thin-film transistor (TFT) and a second TFT;
   wherein a material of an active layer of the first TFT is an organic conductive polymer material;
   an active layer of the second TFT is located in a first concave penetrating through a first insulating layer; and
   a gate of the second TFT is located in a second concave penetrating through the first insulating layer.

2. The array substrate according to claim 1, wherein a source of the first TFT, a drain of the first TFT, and the active layer of the first TFT are formed on a same side of a second insulating layer.

3. The array substrate according to claim 2, wherein a gate of the first TFT is formed on another side of the second insulating layer.

4. The array substrate according to claim 1, wherein the active layer of the second TFT comprises stacked layers of indium and indium selenide.

5. The array substrate according to claim 1, wherein a source of the second TFT, and a gate of the first TFT are disposed in a same layer.

6. The array substrate according to claim 1 further comprising a pixel electrode, wherein a drain of the second TFT and the pixel electrode are disposed in a same layer.

7. The array substrate according to claim 1, wherein the organic conductive polymer material comprises triphenylamine.

8. The array substrate according to claim 1, wherein the organic conductive polymer material comprises a triphenylamine derivative.

* * * * *